(12) United States Patent
Ho et al.

(10) Patent No.: US 9,548,366 B1
(45) Date of Patent: Jan. 17, 2017

(54) SELF ALIGNED CONTACT SCHEME

(71) Applicant: Taiwan Semiconductor Manufacturing Company, Ltd., Hsin-Chu (TW)

(72) Inventors: Tsai-Jung Ho, Xihu Township (TW); Kuang-Yuan Hsu, Taichung (TW); Pei-Ren Jeng, Chu-Bei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/090,341

(22) Filed: Apr. 4, 2016

(51) Int. Cl.
| | |
|---|---|
| *H01L 21/768* | (2006.01) |
| *H01L 29/417* | (2006.01) |
| *H01L 29/78* | (2006.01) |
| *H01L 29/66* | (2006.01) |
| H01L 21/8234 | (2006.01) |

(52) U.S. Cl.
CPC ..... *H01L 29/41783* (2013.01); *H01L 29/6656* (2013.01); *H01L 29/66545* (2013.01); *H01L 29/78* (2013.01); *H01L 21/76897* (2013.01); *H01L 21/823475* (2013.01)

(58) Field of Classification Search
CPC .................. H01L 21/76897; H01L 21/823475
USPC .................................. 438/303, 595; 257/773
See application file for complete search history.

(56) References Cited

U.S. PATENT DOCUMENTS

| | | | | | |
|---|---|---|---|---|---|
| 5,369,303 | A | * | 11/1994 | Wei | H01L 21/76897 257/751 |
| 5,436,188 | A | * | 7/1995 | Chen | H01L 21/76897 257/E21.507 |
| 6,271,087 | B1 | * | 8/2001 | Kinoshita | H01L 21/31144 257/E21.257 |
| 6,362,094 | B1 | * | 3/2002 | Dabbaugh | H01L 21/76832 257/E21.507 |
| 7,667,271 | B2 | | 2/2010 | Yu et al. | |
| 7,910,453 | B2 | | 3/2011 | Xu et al. | |
| 8,377,779 | B1 | | 2/2013 | Wang | |
| 8,399,931 | B2 | | 3/2013 | Liaw et al. | |
| 8,652,894 | B2 | | 2/2014 | Lin et al. | |
| 8,686,516 | B2 | | 4/2014 | Chen et al. | |
| 8,716,765 | B2 | | 5/2014 | Wu et al. | |
| 8,723,272 | B2 | | 5/2014 | Liu et al. | |
| 8,729,627 | B2 | | 5/2014 | Cheng et al. | |
| 8,735,993 | B2 | | 5/2014 | Lo et al. | |
| 8,736,056 | B2 | | 5/2014 | Lee et al. | |
| 8,772,109 | B2 | | 7/2014 | Colinge | |

(Continued)

*Primary Examiner* — George Fourson, III
(74) *Attorney, Agent, or Firm* — Slater Matsil, LLP

(57) ABSTRACT

An embodiment is a method including forming a first gate over a substrate, the first gate having first gate spacers on opposing sidewalls, forming a first hard mask layer over the first gate, forming a second hard mask layer over the first hard mask layer, the second hard mask layer having a different material composition than the first hard mask layer, forming a first dielectric layer adjacent and over the first gate, etching a first opening through the first dielectric layer to expose a portion of the substrate, at least a portion of the second hard mask layer being exposed in the first opening, filling the first opening with a conductive material, and removing the second hard mask layer and the portions of the conductive material and first dielectric layer above the first hard mask layer to form a first conductive contact in the remaining first dielectric layer.

20 Claims, 16 Drawing Sheets

(56) References Cited

U.S. PATENT DOCUMENTS

| | | | |
|---|---|---|---|
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,379,058 B2* | 6/2016 | Song | H01L 23/485 |
| 2010/0224936 A1* | 9/2010 | Hokazono | H01L 21/7681 257/368 |
| 2012/0119307 A1* | 5/2012 | Li | H01L 21/76832 257/410 |
| 2014/0001574 A1 | 1/2014 | Chen et al. | |
| 2014/0077305 A1* | 3/2014 | Pethe | H01L 21/76895 257/368 |
| 2014/0110755 A1 | 4/2014 | Colinge | |
| 2014/0151812 A1 | 6/2014 | Liaw | |
| 2015/0228776 A1* | 8/2015 | Xie | H01L 29/78 257/288 |
| 2015/0318178 A1* | 11/2015 | Pham | H01L 21/28 257/288 |
| 2015/0364326 A1* | 12/2015 | Xie | H01L 29/6653 257/288 |

* cited by examiner

SELF ALIGNED CONTACT SCHEME

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

In particular, as designs shrink, conductive features connecting to layers above and below may become shorted if the conductive feature is misaligned. Generally, this occurs when the etching process through the layer is misaligned such that the conductive feature exposes portions of an adjacent conductive feature on the layer below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
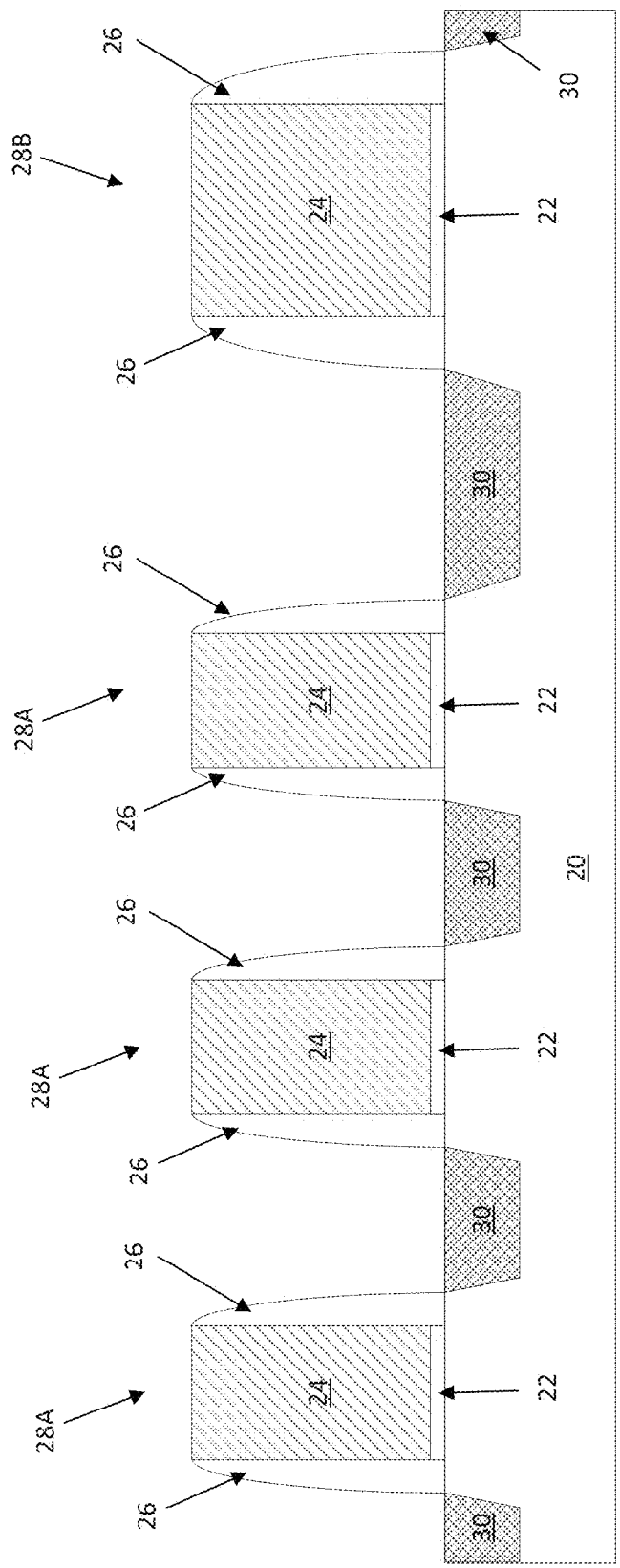
FIGS. 1 through 16 illustrate cross-sectional views of intermediate stages in the manufacturing of a semiconductor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely a self-alignment scheme between two layers. Other embodiments may also be applied, however, to align three or more layers. In some embodiments, the self-alignment scheme utilizes multiple mask layers overlying conductive features of the lower layers to protect the conductive features from unintended exposure during contact opening etching processes. In some embodiments, at least one of the multiple mask layers are metal nitride or metal oxide mask layers and provide sufficient protection and etch selectivity during the contact opening etching processes.

Some embodiments discussed herein are discussed in the context of field-effect transistors (FETs) formed using a gate-last process. In other embodiments, a gate-first process may be used. Also, some embodiments contemplate aspects used in planar devices, such as planar FETs, or fin devices, such as FinFETs.

With reference to FIG. 1, FIG. 1 illustrates a substrate 20, dummy gate stacks 28A and 28B, and source/drain regions 30. The substrate 20 may be a semiconductor substrate, such as a bulk semiconductor, a semiconductor-on-insulator (SOI) substrate, or the like, which may be doped (e.g., with a p-type or an n-type dopant) or undoped. The substrate 20 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 20 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Appropriate wells may be formed in the substrate 20. For example, a P well may be formed in the first region of the substrate 20, and an N well may be formed in a second region of the substrate 20.

The different implant steps for the different wells may be achieved using a photoresist or other masks (not shown). For example, a photoresist is formed and patterned to expose the region the substrate 20 to be implanted. The photoresist can be formed by using a spin-on technique and can be patterned using acceptable photolithography techniques. Once the photoresist is patterned, an n-type impurity and/or a p-type impurity implant is performed in the exposed region, and the photoresist may act as a mask to substantially prevent the impurities from being implanted into the masked region. The n-type impurities may be phosphorus, arsenic, or the like implanted in the first region to a concentration of equal to or less than $10^{18}$ cm$^{-3}$, such as in a range from about $10^{17}$ cm$^{-3}$ to about $10^{18}$ cm$^{-3}$. The p-type impurities may be boron, BF$_2$, or the like implanted in the first region to a concentration of equal to or less than $10^{18}$ cm$^{-3}$, such as in a range from about $10^{17}$ cm$^{-3}$ to about $10^{18}$ cm$^{-3}$. After the implant, the photoresist is removed, such as by an acceptable ashing process.

After the implants of the wells, an anneal may be performed to activate the p-type and/or n-type impurities that were implanted. In some embodiments, substrate 20 may include epitaxially grown regions that may be in situ doped during growth, which may obviate the implantations, although in situ and implantation doping may be used together.

The substrate 20 may include active and passive devices (not shown in FIG. 1). As one of ordinary skill in the art will recognize, a wide variety of devices such as transistors, capacitors, resistors, combinations of these, and the like may be used to generate the structural and functional requirements of the semiconductor device. The devices may be formed using any suitable methods. Only a portion of the substrate 20 is illustrated in the figures, as this is sufficient to fully describe the illustrative embodiments.

The substrate 20 may also include metallization layers (not shown). The metallization layers may be formed over the active and passive devices and are designed to connect the various devices to form functional circuitry. The metallization layers may be formed of alternating layers of dielectric (e.g., low-k dielectric material) and conductive material (e.g., copper) and may be formed through any suitable process (such as deposition, damascene, dual damascene, or the like).

In some embodiments, the substrate 20 may one or more fins that protrude above and from between neighboring isolation regions. For example, the cross-sectional view of FIG. 1 could be along a longitudinal axis of a fin. These one or more fins may be formed in various different processes. In one example, the fins can be formed by etching trenches in a substrate to form semiconductor strips; the trenches can be filled with a dielectric layer; and the dielectric layer can be recessed such that the semiconductor strips protrude from the dielectric layer to form fins. In another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form fins. In still another example, heteroepitaxial structures can be used for the fins. For example, the semiconductor strips can be recessed, and a material different from the semiconductor strips may be epitaxially grown in their place. In an even further example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form fins. In some embodiments where homoepitaxial or heteroepitaxial structures are epitaxially grown, the grown materials may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins may comprise silicon germanium ($Si_xGe_{1-x}$, where x can be between approximately 0 and 100), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

The gate stacks 28 (including 28A and 28B) are formed over the substrate 20. The gate stacks 28 may include a dummy gate dielectric 22, a hard mask (not shown), and a dummy gate electrode 24. The dummy gate dielectric layer (not shown) may be formed by thermal oxidation, chemical vapor deposition (CVD), sputtering, or any other methods known and used in the art for forming a gate dielectric. In some embodiments, the dummy gate dielectric layer includes dielectric materials having a high dielectric constant (k value), for example, greater than 3.9. The dummy gate dielectric materials include silicon nitrides, oxynitrides, metal oxides such as $HfO_2$, $HfZrO_x$, $HfSiO_x$, $HfTiO_x$, $HfAlO_x$, the like, or combinations and multi-layers thereof.

The dummy gate electrode layer (not shown) may be formed over the dummy gate dielectric layer. The gate electrode layer may comprise a conductive material and may be selected from a group comprising polycrystalline-silicon (polysilicon), poly-crystalline silicon-germanium (poly-SiGe), metallic nitrides, metallic silicides, metallic oxides, and metals. In one embodiment, amorphous silicon is deposited and recrystallized to create polysilicon. The dummy gate electrode layer may be deposited by physical vapor deposition (PVD), CVD, sputter deposition, or other techniques known and used in the art for depositing conductive materials. After deposition, a top surface of the dummy gate electrode layer usually has a non-planar top surface, and may be planarized, for example, by a chemical mechanical polishing (CMP) process, prior to patterning of the dummy gate electrode layer or gate etch. Ions may or may not be introduced into the dummy gate electrode layer at this point. Ions may be introduced, for example, by ion implantation techniques.

A hard mask layer (not shown) is formed over the dummy gate electrode layer. The hard mask layer may be made of SiN, SiON, $SiO_2$, the like, or a combination thereof. The hard mask layer is then patterned. The patterning of the hard mask layer may be accomplished by depositing mask material (not shown) such as photoresist over the hard mask layer. The mask material is then patterned and the hard mask layer is etched in accordance with the pattern to form hard masks. The dummy gate electrode layer and the dummy gate dielectric layer may be patterned to form the dummy gate electrodes 24 and dummy gate dielectrics 22, respectively. The gate patterning process may be accomplished by using the hard masks as a pattern and etching the dummy gate electrode layer and the dummy gate dielectric layer to form the gate stacks 28.

After the formation of the gate stacks 28, source/drain regions 30 may be formed in the substrate 20. The source/drain regions 30 may be doped by performing an implanting process to implant appropriate dopants to complement the dopants in the substrate 20. In another embodiment, the source/drain regions 30 may be formed by forming recesses (not shown) in substrate 20 and epitaxially growing material in the recesses. The source/drain regions 30 may be doped either through an implantation method as discussed above, or else by in-situ doping as the material is grown. In this embodiment, epitaxial source/drain regions 30 may include any acceptable material, such as appropriate for n-type FETs and/or p-type FETs. For example, in an n-type configuration, if the substrate 20 is silicon, the epitaxial source/drain regions 30 may include silicon, SiC, SiCP, SiP, or the like. For example, in an n-type configuration, if the substrate 20 is silicon, the epitaxial source/drain regions 30 may comprise SiGe, SiGeB, Ge, GeSn, or the like. The epitaxial source/drain regions 30 may have surfaces raised above top surfaces of the substrate 20 and may have facets.

In an embodiment, the gate stacks 28 and the source/drain regions 30 may form transistors, such as metal-oxide-semiconductor FETs (MOSFETs). In these embodiments, the MOSFETs may be configured in a PMOS or an NMOS configuration. In a PMOS configuration, the substrate 20 is doped with n-type dopants and the source/drain regions 30 are doped with p-type dopants. In an NMOS configuration, the substrate is doped with p-type dopants and the source/drain regions 30 are doped with n-type dopants.

Gate spacers 26 are formed on opposite sides of the gate stacks 28. The gate spacers 26 are formed by blanket depositing a spacer layer (not shown) on the previously formed gates stacks 28. In an embodiment, the gate spacers 26 include a spacer liner (not shown). The spacer liner may be made of SiN, SiC, SiGe, oxynitride, oxide, the like, or a combination thereof. The spacer layer may comprise SiN, oxynitride, SiC, SiON, oxide, combinations thereof, or the like and may be formed by methods utilized to form such a layer, such as CVD, plasma enhanced CVD (PECVD), low pressure CVD (LPCVD), atomic layer deposition (ALD), sputter, the like, or a combination thereof. The gate spacers 26 are then patterned, for example, by an anisotropic etch to remove the spacer layer from horizontal surfaces, such as top surfaces of the gate stacks 28 and a top surface of the substrate 20.

In another embodiment, the source/drain regions 30 may include a lightly doped region (sometimes referred to as a LDD region) and a heavily doped region. In this embodiment, before the gate spacers 26 are formed, the source/drain regions 30 lightly doped with an implantation process using the gate stacks 28 as masks. After the gate spacers 26 are formed, the source/drain regions 30 may then be heavily doped with an implantation process using the gate stacks 28 and gate spacers 26 as masks. This forms lightly doped regions and heavily doped regions. The lightly doped regions are primarily underneath the gate spacers 26 while the heavily doped regions are outside of the gate spacers along the substrate 20.

Although the description above described the formation of gates 28, the structures 28 are not limited to gates. In some embodiments, the structures 28 are conductive lines 28 that are to be aligned and coupled with other conductive features by subsequently formed conductive features.

As illustrated in FIG. 1, the gate stack 28B has a width that is greater than the widths of the dummy gate stacks 28A. In addition, the pitch between the dummy gate stack 28B and the nearest dummy gate stack 28A is larger than the pitch between the dummy gate stacks 28A. The locations of these different types of gate stacks 28 are to illustrate various configurations of the disclosed embodiments and the locations of the various gate stacks 28 are not limited to these exact locations.

Figure 2:
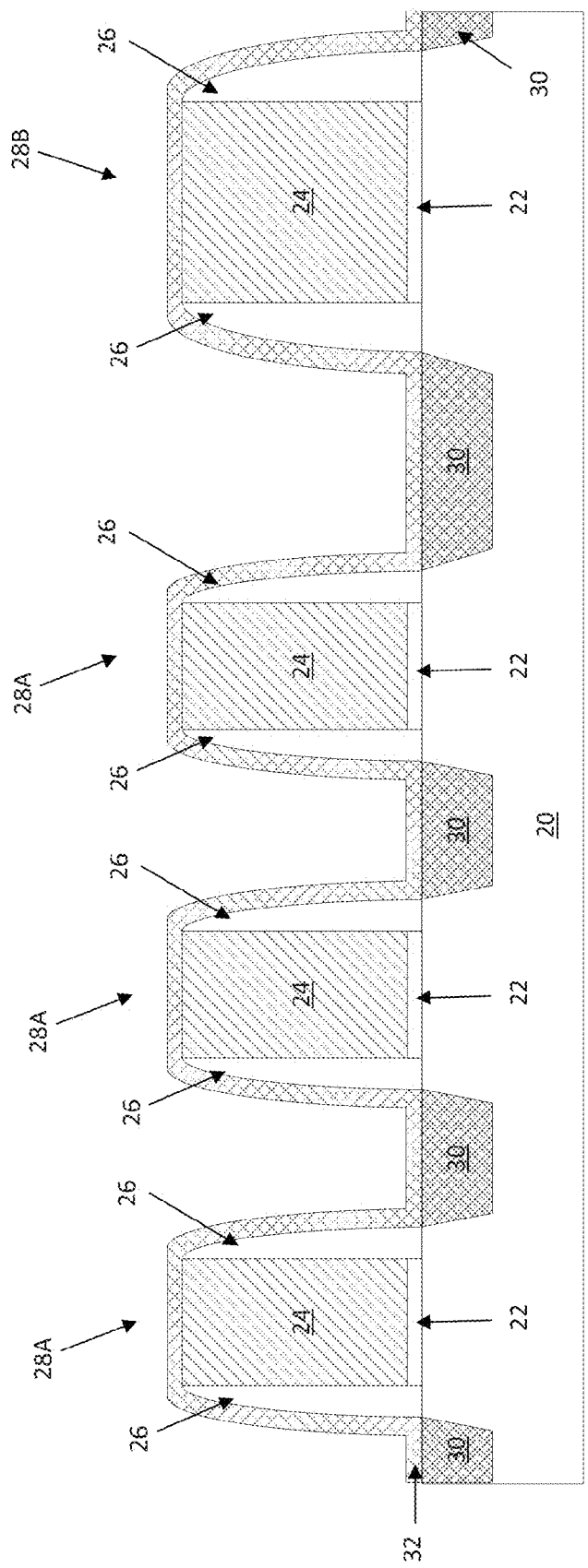

FIG. 2 illustrates the formation of an etch stop layer 32 over the substrate 20, the gate stacks 28, the gate spacers 26, and the source/drain regions 30. The etch stop layer 32 may be conformally deposited over components on the substrate 20. In some embodiments, the etch stop layer 32 may be silicon nitride, silicon carbide, silicon oxide, low-k dielectrics such as carbon doped oxides, extremely low-k dielectrics such as porous carbon doped silicon dioxide, the like, or a combination thereof, and deposited by CVD, PVD, ALD, a spin-on-dielectric process, the like, or a combination thereof.

Figure 3:
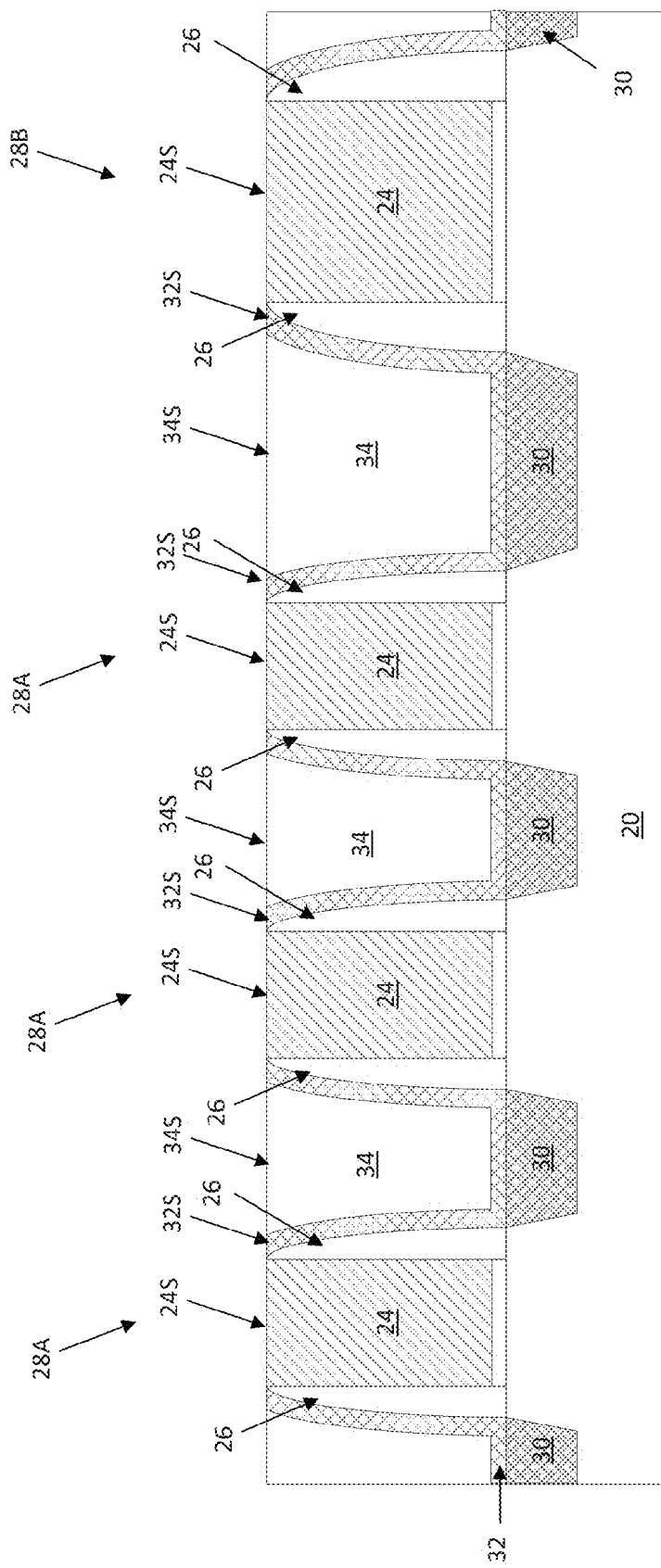

In FIG. 3, an interlayer dielectric (ILD) 34 is deposited over the structure illustrated in 2. In an embodiment, the ILD 34 is a flowable film formed by a flowable CVD. In some embodiments, the ILD 34 is formed of oxides such as silicon oxide, Phospho-Silicate Glass (PSG), Boro-Silicate Glass (BSG), Boron-Doped Phospho-Silicate Glass (BPSG), undoped Silicate Glass (USG), low-k dielectrics such as carbon doped oxides, extremely low-k dielectrics such as porous carbon doped silicon dioxide, a polymer such as polyimide, the like, or a combination thereof. The low-k dielectric materials may have k values lower than 3.9. The ILD 34 may be deposited by any suitable method such as by CVD, ALD, a spin-on-dielectric (SOD) process, the like, or a combination thereof.

Further in FIG. 3, a planarization process, such as a CMP process, may be performed to level the top surface 34S of the ILD 34 with top surfaces 24S of the dummy gates electrodes 24 and top surfaces 32S of the etch stop layer 32. The CMP process may also remove the hard masks, if present, on the dummy gates electrodes 24. Accordingly, top surfaces 24S of the dummy gates electrodes 24 are exposed through the ILD 34.

Figure 4:
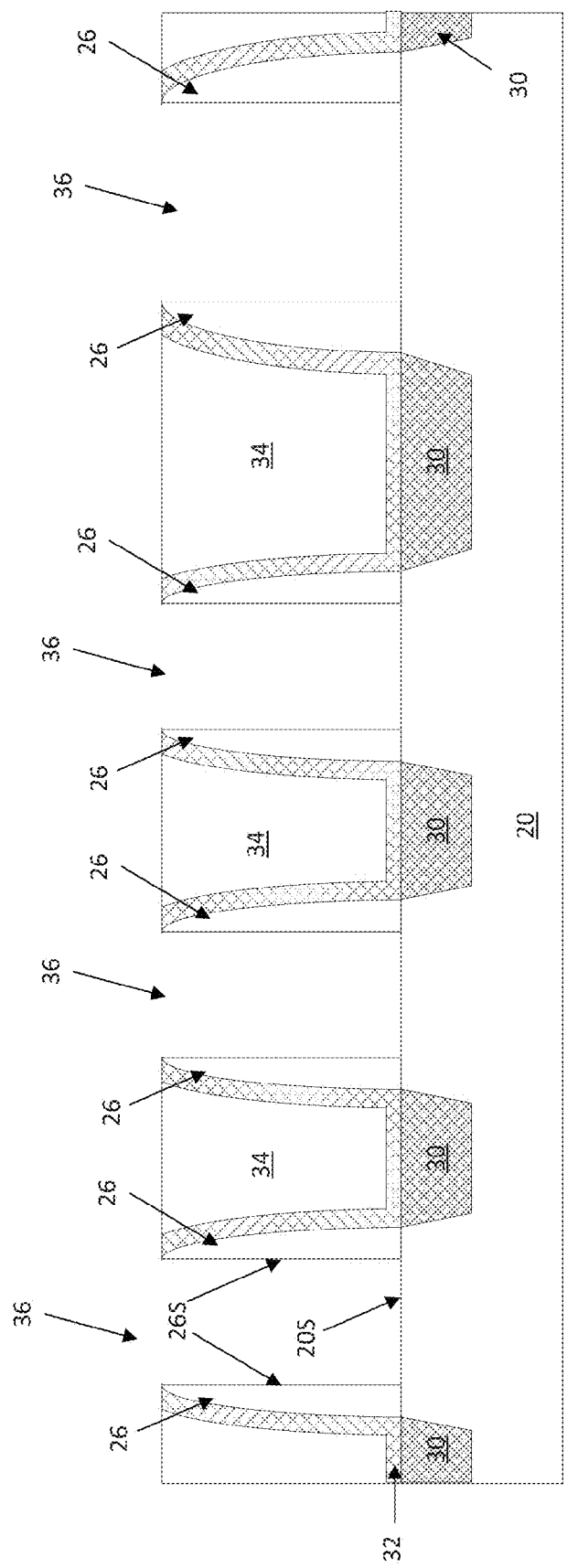

In FIG. 4, the dummy gate electrodes 24 and the dummy gate dielectrics 22 directly underlying the dummy gate electrodes 24 are removed in an etching step(s), so that recesses 36 are formed. Each recess 36 exposes a channel region of a respective FET in the embodiment where MOSFETs are being formed. Each channel region is disposed between neighboring pairs of source/drain regions 30. During the removal, the dummy gate dielectrics 22 may be used as an etch stop layer when the dummy gate electrodes 24 are etched. The dummy gate dielectrics 22 may then be removed after the removal of the dummy gate electrodes 24 The recesses 36 are defined by the exposed surfaces 20S of the substrate 20 and exposed inner surfaces 26S of the gate spacers 26.

Figure 5:
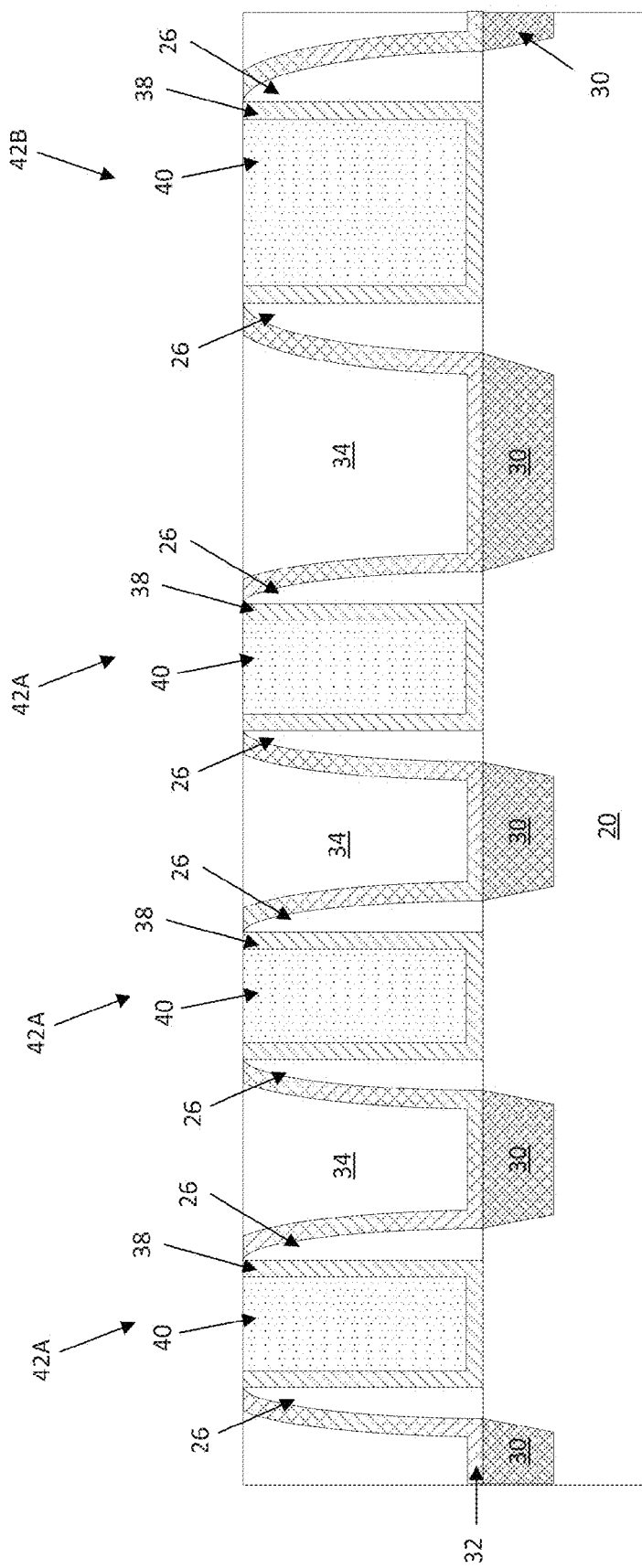

In FIG. 5, gate dielectric layers 38 and gate electrodes 40 are formed for replacement gates. The gate dielectric layers 38 are deposited conformally in recesses 36, such as on the top surface of the substrate and on sidewalls of the gate spacers 26, and on a top surface of the ILD 34. In accordance with some embodiments, gate dielectric layers 38 comprise silicon oxide, silicon nitride, or multilayers thereof. In other embodiments, gate dielectric layers 38 include a high-k dielectric material, and in these embodiments, gate dielectric layers 38 may have a k value greater than about 7.0, and may include a metal oxide or a silicate of Hf, Al, Zr, La, Mg, Ba, Ti, Pb, and combinations thereof. The formation methods of gate dielectric layers 38 may include molecular-beam deposition (MBD), ALD, PECVD, and the like.

Next, gate electrodes 40 are deposited over gate dielectric layers 38, respectively, and fill the remaining portions of the recesses 36. Gate electrodes 40 may be made of a metal-containing material such as TiN, TaN, TaC, Co, Ru, Al, combinations thereof, or multi-layers thereof. After the filling of gate electrodes 40, a planarization process, such as a CMP process, may be performed to remove the excess portions of gate dielectric layers 38 and the material of gate electrodes 40, which excess portions are over the top surface of ILD 34. The resulting remaining portions of material of gate electrodes 40 and gate dielectric layers 38 thus form replacement gates 42 (including replacement gates 42A and 42B).

In a complementary MOS (CMOS) embodiment with both NMOS and PMOS devices on the substrate 20, the formation of the gate dielectric layers 38 in both the PMOS and NMOS regions may occur simultaneously such that the gate dielectric layers 38 in both the PMOS and NMOS regions are made of the same materials, and the formation of the gate electrodes 40 in both the PMOS and NMOS regions may occur simultaneously such that the gate electrodes 40 in both the PMOS and NMOS regions are made of the same materials. However, in other embodiments, the gate dielectric layers 38 in the NMOS region and the PMOS region may be formed by distinct processes, such that the gate dielectric layers 38 in the NMOS region and the PMOS region may be made of different materials, and the gate electrodes 40 in the NMOS region and the PMOS region may be formed by distinct processes, such that the gate electrodes 40 in the NMOS region and the PMOS region may be made of different materials. Various masking steps may be used to mask and expose appropriate regions when using distinct processes.

Figure 6:
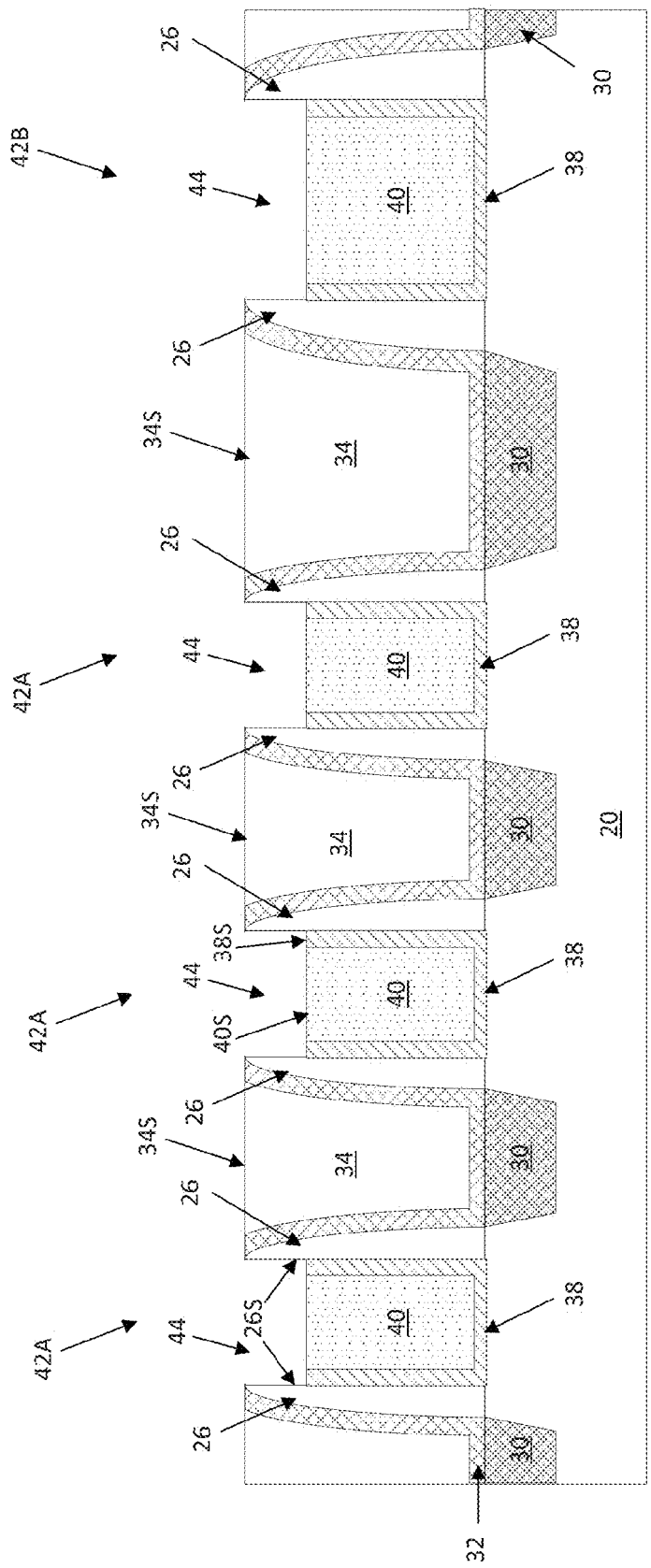

In FIG. 6, the gate electrodes 40 and the gate dielectrics 38 are recessed in an etching step(s), so that recesses 44 are formed. The recesses 44 allow for subsequently formed hard masks to be formed within the recesses 44 to protect the replacement gates 42. The recesses 44 are defined by the exposed inner surfaces 26S of the gate spacers 26 and the recessed top surfaces 40S and 38S of the gate electrodes 40 and gate dielectrics 38, respectively.

Further, the bottom surfaces of the recesses 44 may have a flat surface as illustrated, a convex surface, a concave surface (such as dishing), or a combination thereof. The bottom surfaces of the recesses 44 may be formed flat, convex, and/or concave by an appropriate etch. The gate electrodes 40 and the gate dielectrics 38 may be recessed using an acceptable etching process, such as one that is selective to the materials of the gate electrodes 40 and the gate dielectrics 38.

Figure 7:
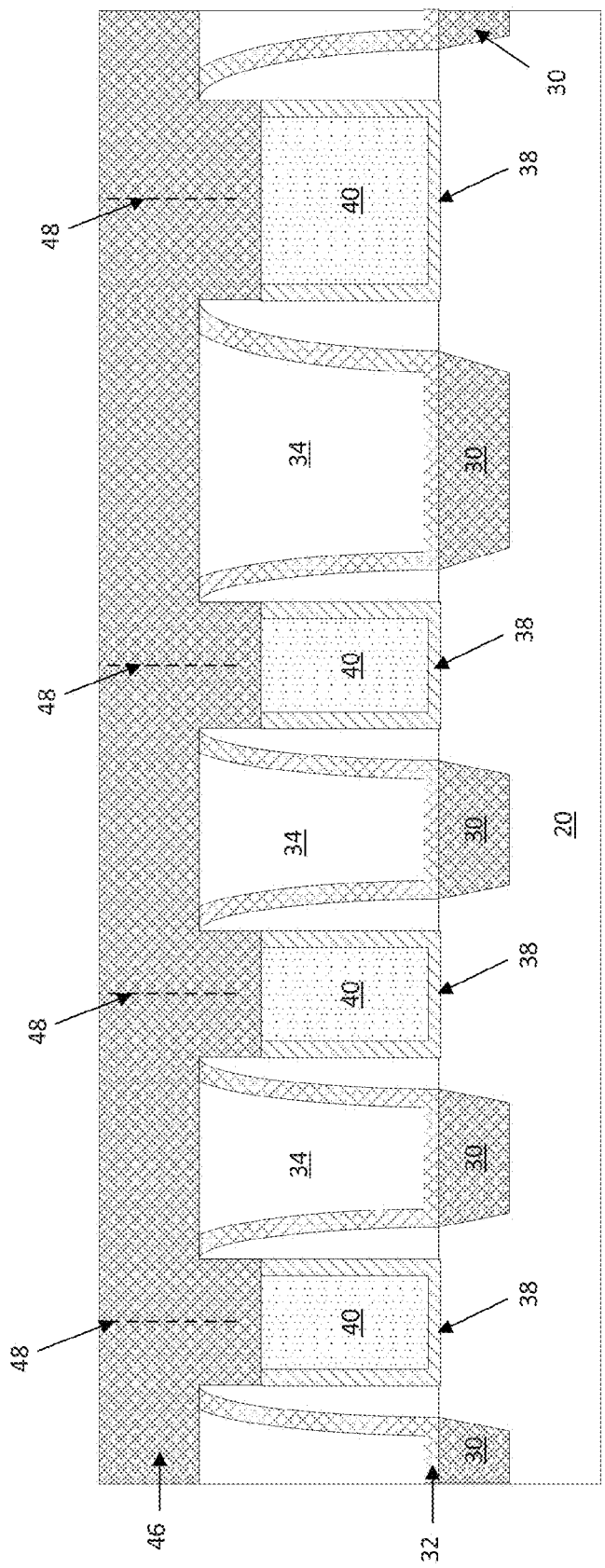

In FIG. 7, a first hard mask layer 46 is formed over the ILD 34 and within the recesses 44 over gate electrodes 40 and the gate dielectrics 38. The first hard mask layer 46 may be made of SiN, SiON, SiO$_2$, the like, or a combination thereof. The first hard mask layer 46 may be formed by CVD, PVD, ALD, a spin-on-dielectric process, the like, or a combination thereof. The formation of the first hard mask layer 46 within the recesses 44 may cause seams and/or voids 48 to be formed within the first hard mask layer 46 due to the aspect ratio of the recesses at the smaller technology nodes such as nodes at 10 nm or less. These seams and/or voids 48 can be weak points within the first hard mask layer 46 that may allow for the gate electrodes 40 and/or the gate dielectrics 38 to be unintentionally exposed during a subsequent etching process.

Figure 8:
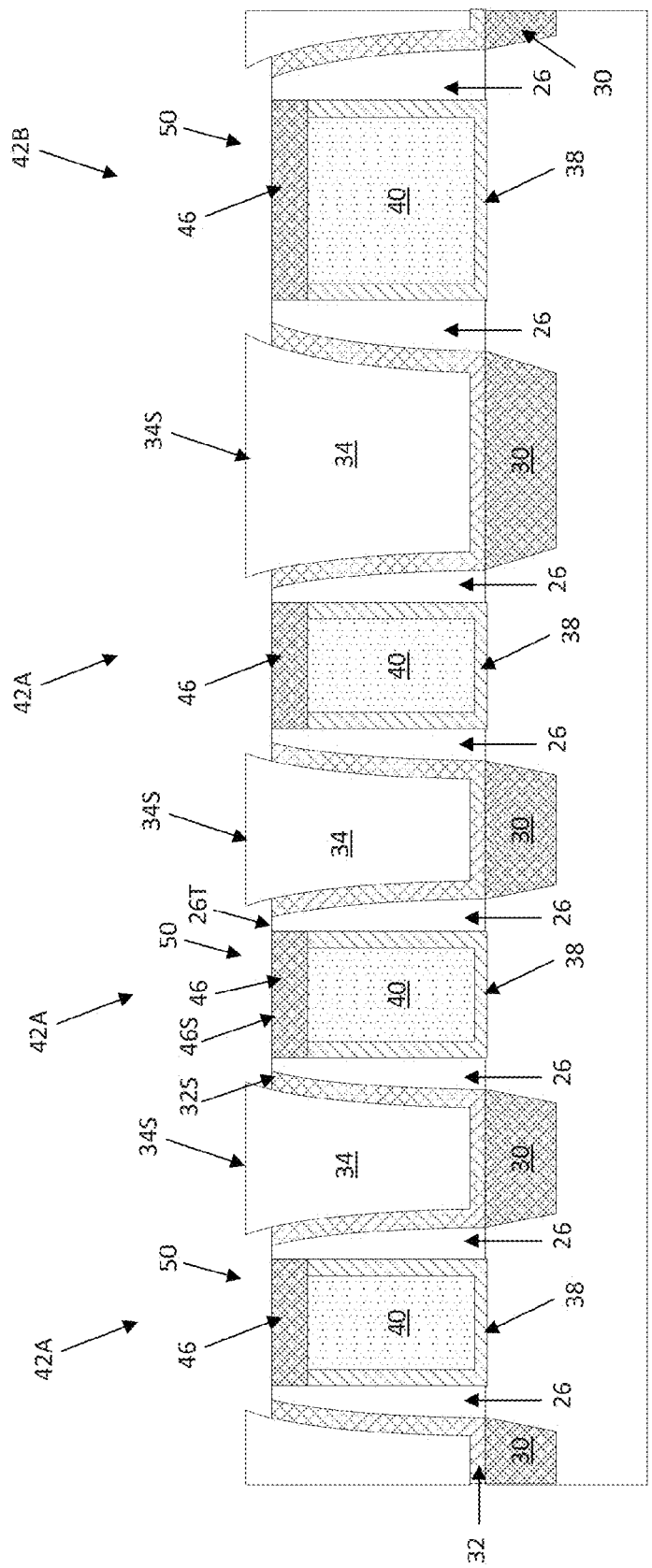

FIG. 8 illustrates recessing the first hard mask layer 46 to form recesses 50. In some embodiments, the first hard mask layer 46, the etch stop layer 32, and the gate spacers 26 are recessed such that top surfaces 46S, 26T, and 32S of the first hard mask layer 46, the etch stop layer 32, and the gate spacers 26, respectively, are below top surfaces 34S of the ILD 34. In some embodiments, the recessing of the first hard mask layer 46 completely removes the seams and/or voids 48 in the first hard mask layer 46, and, in other embodiments, at least a portion of the seams and/or voids 48 remains after the recessing process.

Further, the bottom surfaces of the recesses 50 may have a flat surface as illustrated, a convex surface, a concave surface (such as dishing), or a combination thereof. The bottom surfaces of the recesses 50 may be formed flat, convex, and/or concave by an appropriate etch. The first hard mask layer 46 may be recessed using an acceptable etching process, such as one that is selective to the materials of the first hard mask layer 46, the etch stop layer 32, and the gate spacer 26. For example, an etch process may include the formation of a reactive species from an etchant gas using a plasma. In some embodiments, the plasma may be a remote plasma. The etchant gas may include a fluorocarbon chemistry such as $C_4F_6/CF_4/C_5F$ and $NF_3/O_2/N_2/Ar/H_3/H_2$, the like, or a combination thereof. In some embodiments, the etchant gas may be supplied to the etch chamber at a total gas flow of from about 100 to about 1000 sccm. In some embodiments, the pressure of the etch chamber during the etch process is from about 10 mtorr to about 50 mtorr. In some embodiments, the etchant gas may comprise between about 10 to about 90 percent hydrogen gas. In some embodiments, the etchant gas may comprise between about 20 to about 80 percent inert gas.

Figure 9:
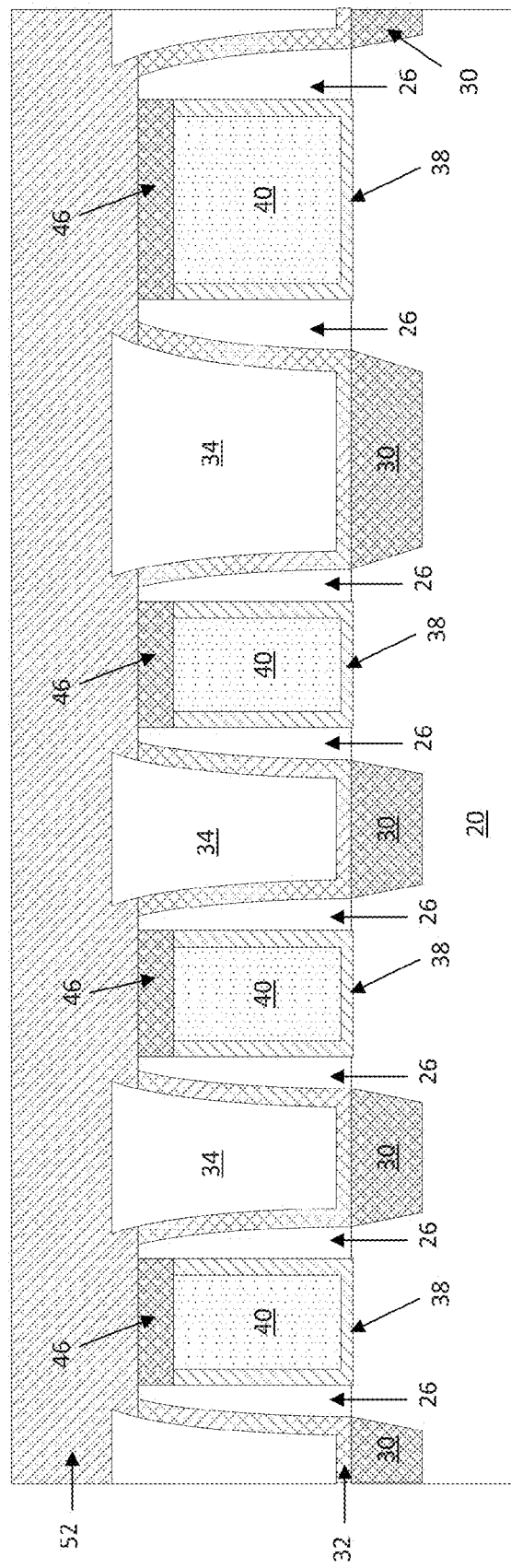

In FIG. 9, a second hard mask layer 52 is formed over the first hard mask layer 46, the gate spacers 26, the etch stop layer 32, and the ILD 34 and within the recesses 50. The second hard mask layer 52 provides protection for the first hard mask layer 46, the gate spacers 26, and the etch stop layer 32 during the subsequent self-aligned contact etching (see FIG. 12) to ensure that the self-aligned contact does not short one of the gate electrodes 40 to the corresponding source/drain region 30. The second hard mask layer 52 may be made of a metal, a metal oxide, a metal nitride, pure silicon, the like, or a combination thereof. Some examples of the metal oxide and metal nitride are TiO, HfO, AlO, ZrO, ZrN, the like, or a combination thereof. The material composition of the second hard mask layer 52 is important as it ensures a high film density and a non-volatile etching byproduct, such as, for example a metal fluoride etching byproduct. Further, the materials available for use in the second hard mask layer 52 are larger than the materials available for use in the first hard mask layer 46 because the second hard mask layer 52 will be subsequently removed (see FIG. 15), and thus, these materials will not impact subsequent processing. The second hard mask layer 52 may be formed by CVD, PVD, ALD, a spin-on-dielectric process, the like, or a combination thereof.

Figure 10:
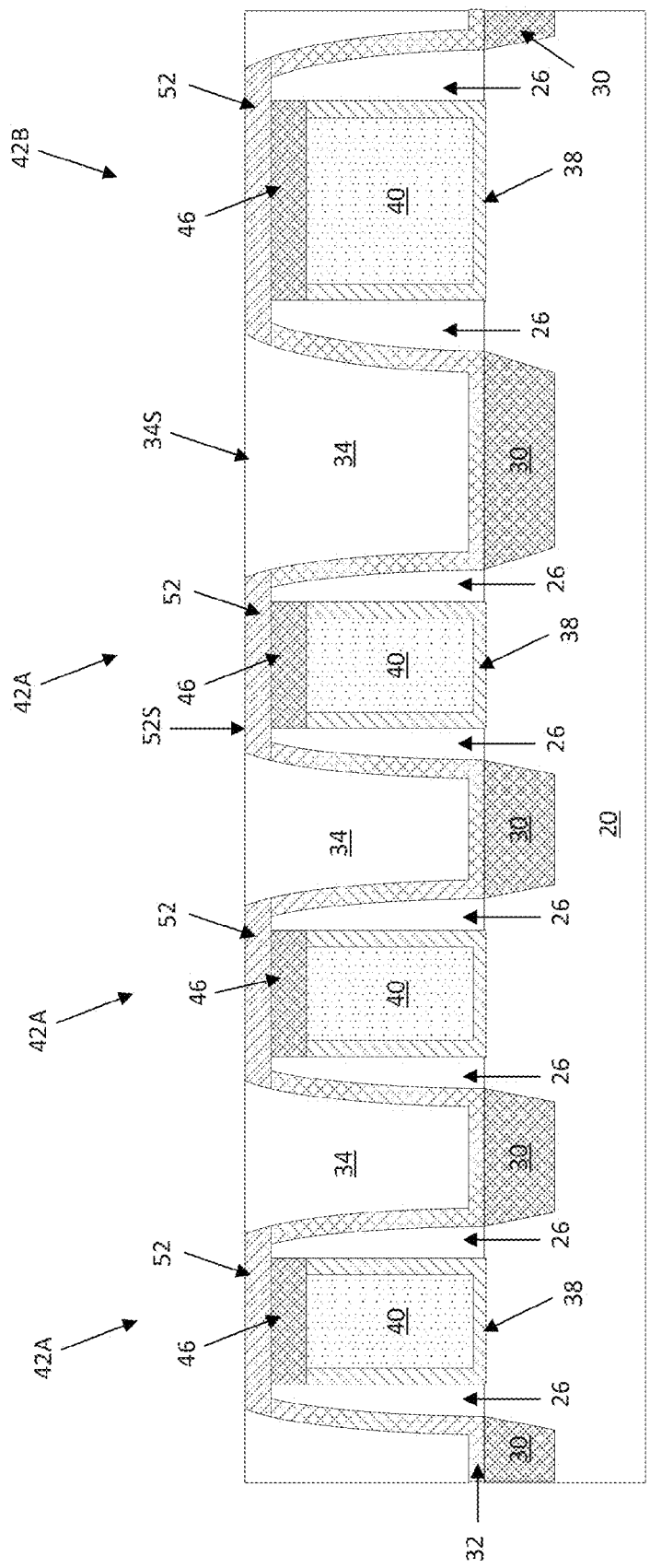

In FIG. 10, a planarization process, such as a CMP process, may be performed to level the top surface 34S of the ILD 34 with top surfaces 52S of the second hard mask layer 52. Accordingly, top surfaces 34S of the ILD 34 are exposed.

Figure 11:
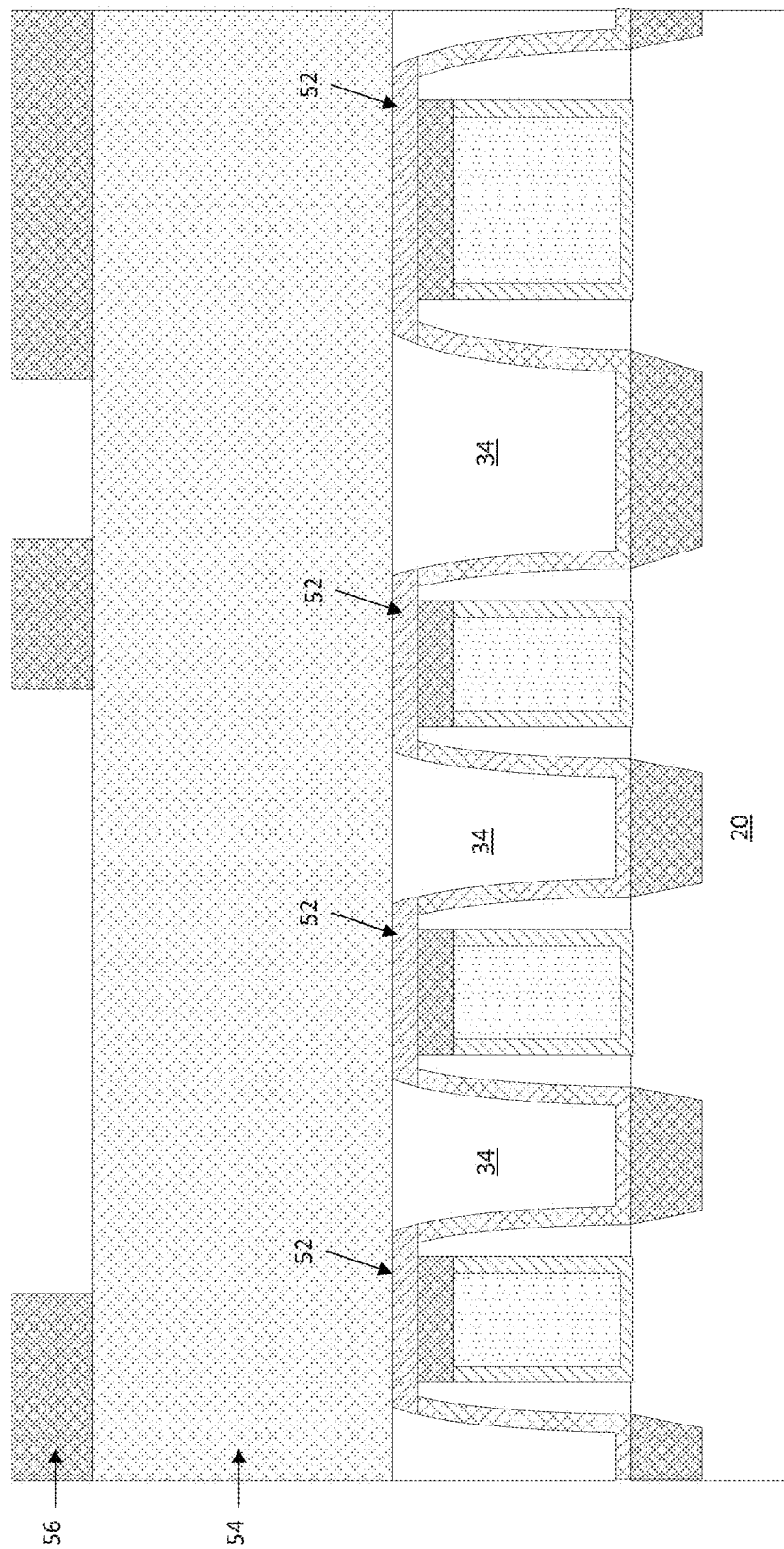

In FIG. 11, an ILD 54 is deposited over the structure illustrated in 10. In an embodiment, the ILD 54 is a flowable film formed by a flowable CVD. In some embodiments, the ILD 54 is formed of oxides such as silicon oxide, PSG, BSG, BPSG, USG, low-k dielectrics such as carbon doped oxides, extremely low-k dielectrics such as porous carbon doped silicon dioxide, a polymer such as polyimide, the like, or a combination thereof. The low-k dielectric materials may have k values lower than 3.9. The ILD 54 may be deposited by any suitable method such as by CVD, ALD, a SOD process, the like, or a combination thereof. In some embodiments, the ILD 54 is planarized by a CMP process or an etching process to form a substantially planar top surface.

Further in FIG. 11, a hard mask layer 56 is formed over the ILD 54 and patterned. The hard mask layer 56 may be made of SiN, SiON, SiO$_2$, the like, or a combination thereof. The hard mask layer 56 may be formed by CVD, PVD, ALD, a SOD process, the like, or a combination thereof. The hard mask layer 56 is then patterned. The patterning of the hard mask layer 56 may be accomplished by depositing mask material (not shown) such as photoresist over the hard mask layer 56. The mask material is then patterned and the hard mask layer 56 is etched in accordance with the pattern to form a patterned hard mask layer 56.

Figure 12:
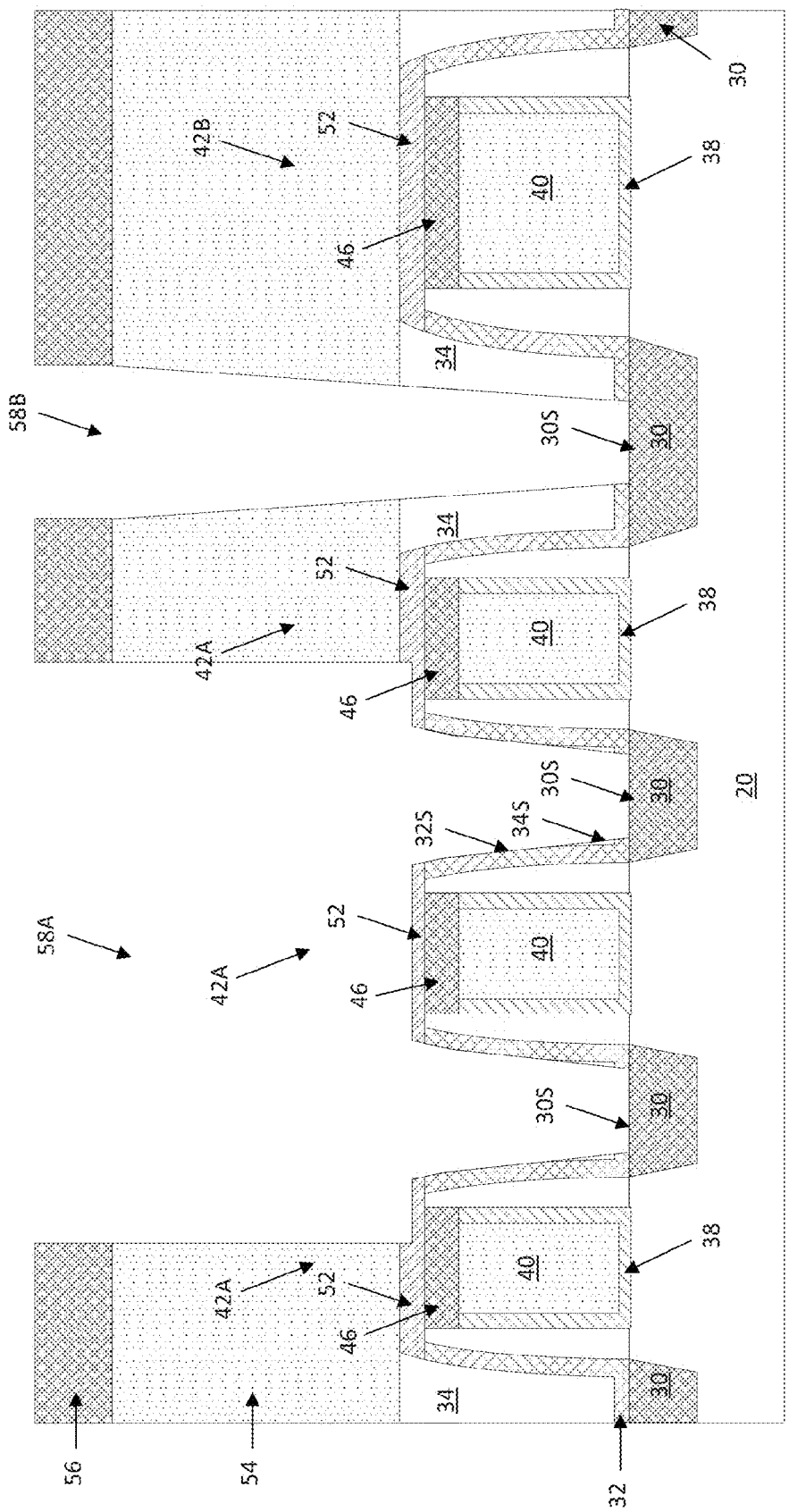

FIG. 12 illustrates the formation of the openings 58A and 58B through the ILD 54 and through the ILD 34 using the patterned hard mask layer 56 as a mask to expose portions of the substrate 20. In the illustrated embodiment, the openings 58A and 58B expose portions surfaces 30S of the source/drain regions 30, and, in other embodiments, where the source/drain regions 30 are not present, the openings 58A and 58B can expose other features, such as, for example, a metal feature in the substrate 20. Although portions of the opening 58A extend over top surfaces of the gate stacks 42A, the second hard mask layer 52 and the etch stop layer 32 self-align the opening 58A between adjacent pairs of gate stacks 42A to the substrate 20. In the illustrated embodiment, the opening 58B is not self-aligned as the pitch between the gate stack 42B and the nearest gate stack 42A is larger than the pitch of the gate stacks 42A and self-aligned openings are not necessary for this larger pitch. The openings 58A and 58B may be formed by using acceptable etching techniques. In an embodiment, the openings 58A and 58B are formed by an anisotropic dry etch process. For example, the etching process may include a dry etch process using a reaction gas that selectively etches ILDs 54 and 34 without etching the second hard mask layer 52. For example, an etch process may include the formation of a reactive species from an etchant gas using a plasma. In some embodiments, the plasma may be a remote plasma. The etchant gas may include a fluorocarbon chemistry such as $C_4F_6/CF_4/C_5F$ and $NF_3/O_2/N_2/Ar/H_3/H_2$, the like, or a combination thereof. In some embodiments, the etchant gas may be supplied to the etch chamber at a total gas flow of from about 100 to about 1000 sccm. In some embodiments, the pressure of the etch chamber during the etch process is from about 10 mtorr to about 50 mtorr. The second hard mask layer 52 acts like an etch stop layer and advantageously prevents damage to underlying features (e.g., gate spacer 26, first hard mask layer 46, and gate stacks 42) even when patterning misalignment errors occur. Absent the second hard mask layer 52, the gate spacers 26, the first hard mask layers 46, and the gate stacks 42 may be inadvertently damaged by the etching process. In some embodiments, the etching process used for the self-aligned opening 58A may remove some upper portions of the second hard mask layer 52, but does not completely etch through the second hard mask layer 52 such that the first hard mask layer 46, the gate spacers 26, and the covered portions of the etch stop layer 32 are protected during the etching process.

Figure 13:
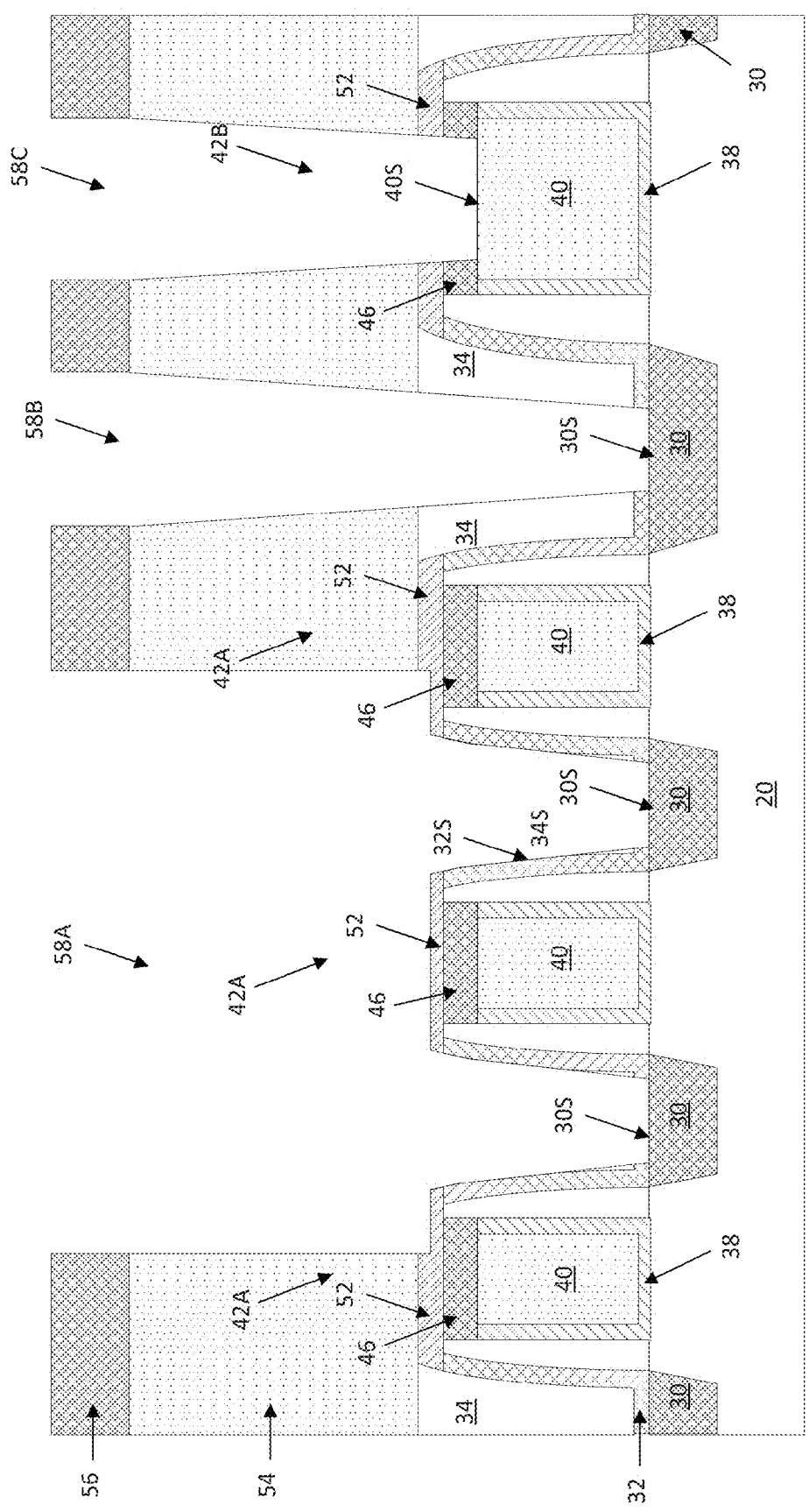

In FIG. 13, the hard mask layer 56 is further patterned and opening 58C is formed through the ILD 54, the second hard mask layer 52 overlying the gate stack 42B, and the first hard mask layer 46 overlying the gate stack 42B using the patterned hard mask layer 56 as a mask to expose a portion of the surface 40S of the gate electrode 40 of the gate stack 42B. The patterning of the hard mask layer 56 may be accomplished by depositing mask material (not shown) such as photoresist over the hard mask layer 56. The mask material is then patterned and the hard mask layer 56 is etched in accordance with the pattern to form the patterned hard mask layer 56. The mask material may remain over the openings 58A and 58B during the formation of the opening 58C to protect the structures within the openings 58A and 58B. In the illustrated embodiment, the opening 58C is not self-aligned. The opening 58C may be formed by using acceptable etching techniques. In an embodiment, the opening 58C and is formed by an anisotropic dry etch process.

Figure 14:
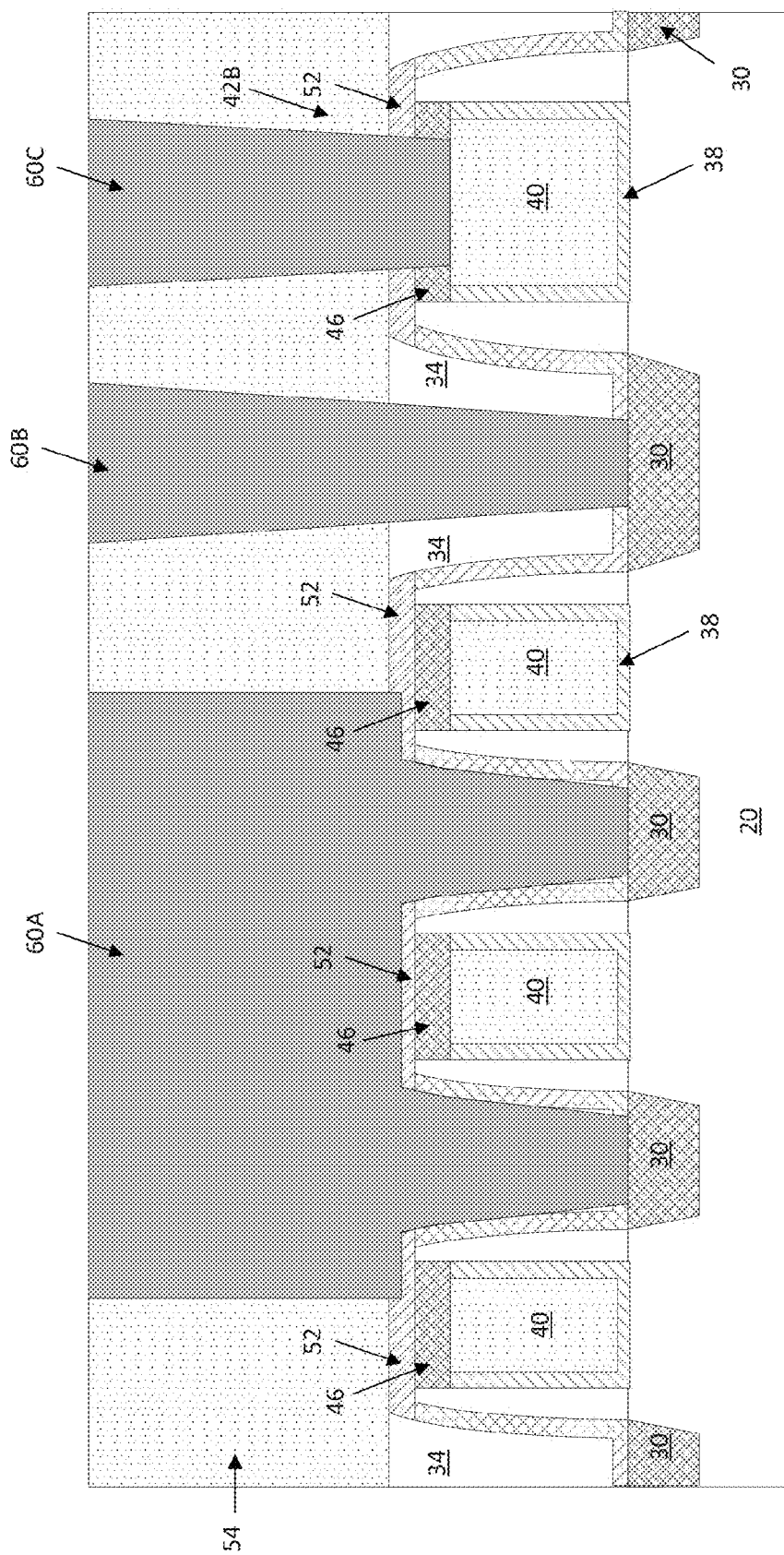

FIG. 14 illustrates the formation of a conductive layer 60 in the openings 58A, 58B, and 58C. The conductive layer 60 in the opening 58A contacts the exposed surface of the substrate 20 and is along exposed surfaces of the etch stop layer 32, the ILDs 34 and 54, and top surfaces of the second hard mask layer. The conductive layer 60 in the opening 58B contacts the exposed surface of the substrate 20 and is along exposed surfaces of the etch stop layer 32 and the ILDs 34 and 54. In the illustrated embodiment, the conductive layer 60 in the openings 58A and 58B contacts the expose surfaces of the source/drain regions 30, and, in other embodiments, where the source/drain regions 30 are not present, the conductive layer 60 in the openings 58A and 58B contacts other features, such as, for example, a metal feature in the substrate 20. The conductive layer 60 in the opening 58C contacts the exposed surface of the gate electrode 40 of the gate stack 42B and is along exposed surfaces of the first and second hard mask layers 46 and 52 and the ILD 54.

In some embodiments, the conductive layer 60 includes a barrier layer (not shown). The barrier layer helps to block diffusion of the subsequently formed conductive layer 60 into adjacent dielectric materials such as ILDs 34 and 54. The barrier layer may be made of titanium, titanium nitride, tantalum, tantalum nitride, manganese, manganese oxide, cobalt, cobalt oxide, cobalt nitride, nickel, nickel oxide, nickel nitride, silicon carbide, oxygen doped silicon carbide, nitrogen doped silicon carbide, silicon nitride, aluminum oxide, aluminum nitride, aluminum oxynitride, a polymer such as polyimide, polybenzoxazole (PBO) the like, or a combination thereof. The barrier layer may be formed by CVD, PVD, PECVD, ALD, SOD, the like, or a combination thereof. In some embodiments, the barrier layer is omitted.

The conductive layer 60 may be made of tungsten, copper, aluminum, the like, or a combination thereof. The conductive layer 60 may be formed through a deposition process such as electrochemical plating, PVD, CVD, the like, or a combination thereof. In some embodiments, the conductive layer 60 is formed on a copper containing seed layer, such as AlCu.

In some embodiments, the conductive layer 60 is formed to have excess material overlying a top surface of the ILD 54. In these embodiments, the conductive layer 60 is planarized by a grinding process such as a CMP process to form conductive features 60A, 60B, and 60C in the openings 58A, 58B, and 58C, respectively. In some embodiments, the top surfaces of the conductive features 60A, 60B, and 60C are level with the top surface of the ILD 54 after the planarization process.

Figure 15:
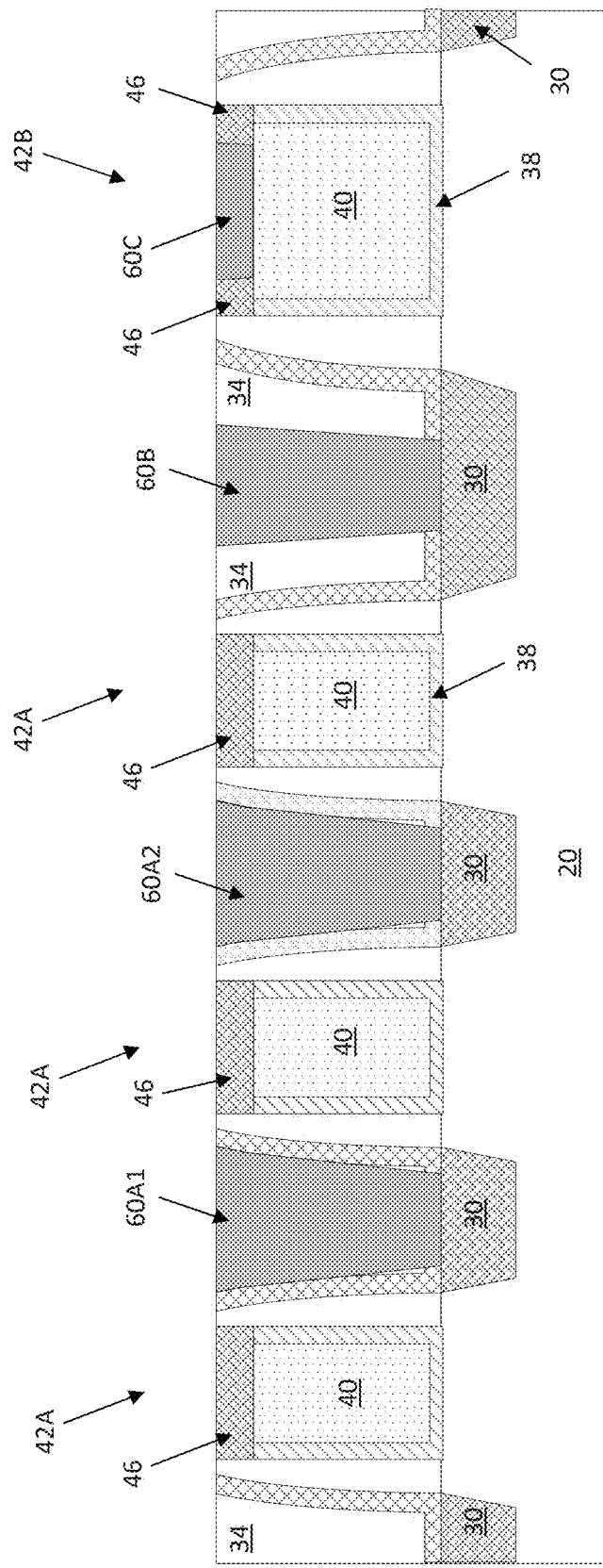

FIG. 15 illustrates the removal of the ILD 54, the second hard mask layer 52, and the portion of the ILD 34 and conductive features 60A, 60B, and 60C at levels above the top surfaces of the first hard mask layer 46. This removal may be performed by one or more etching processes and/or grinding processes such as CMP processes. After the removal process, the conductive feature 60A is now two separated conductive features 60A1 and 60A2 and the conductive features 60C is now embedded in the first hard mask layer 46 overlying the gate stack 42B. In addition, after the removal process, the top surfaces of the conductive features 60A1, 60A2, 60B, and 60C are level with the top surface of the ILD 34 and the first hard mask layer 46.

Figure 16:
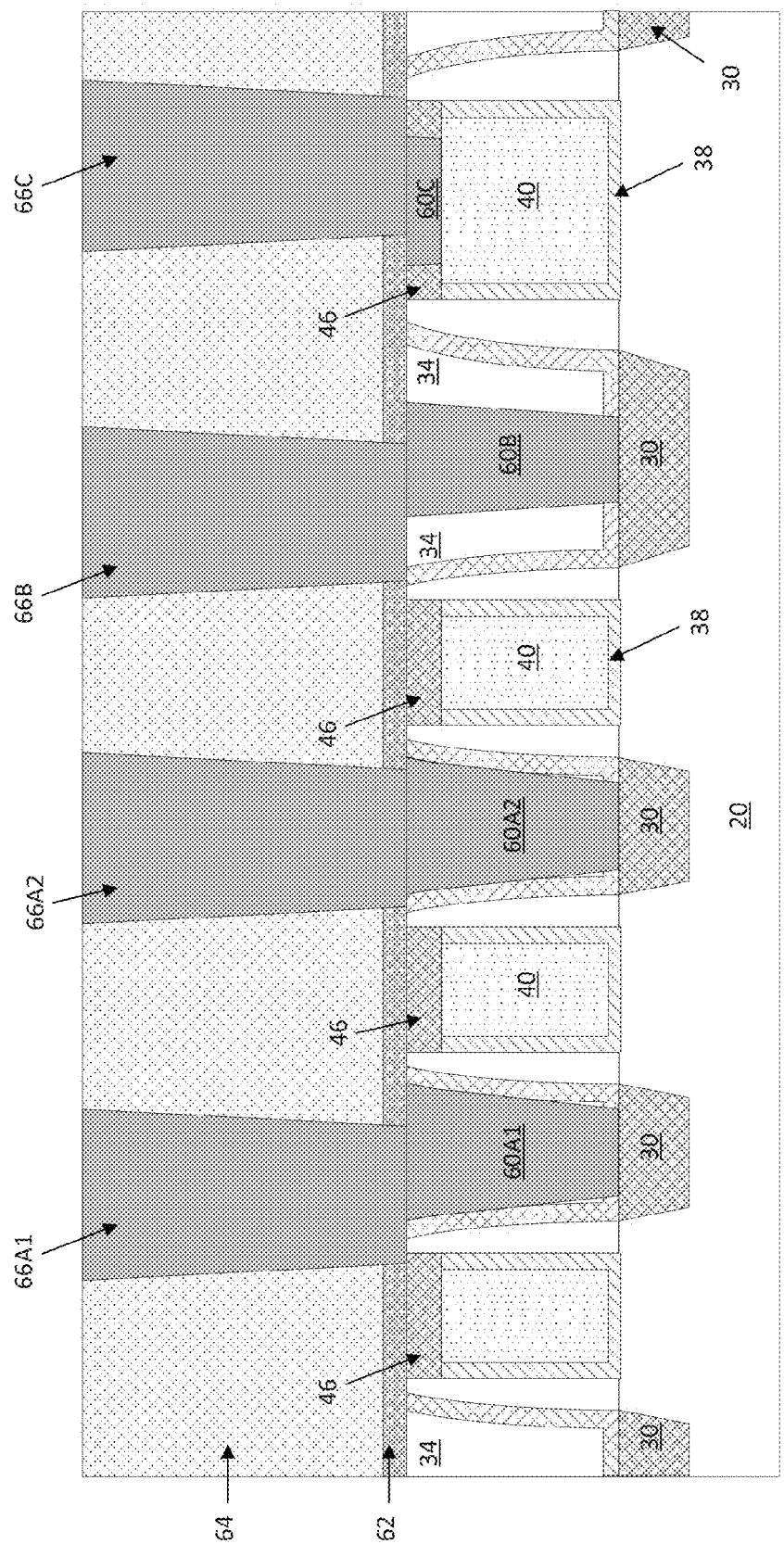

FIG. 16 illustrates the formation of an etch stop layer 62 over the structure of FIG. 15. The etch stop layer 62 is formed over the ILD 34, the etch stop layer 32, the first hard mask layers 46, and the gate spacers 26. The etch stop layer 62 may be conformally deposited over these components. In some embodiments, the etch stop layer 62 may be silicon nitride, silicon carbide, silicon oxide, low-k dielectrics such as carbon doped oxides, extremely low-k dielectrics such as porous carbon doped silicon dioxide, the like, or a combination thereof, and deposited by CVD, PVD, ALD, a spin-on-dielectric process, the like, or a combination thereof.

Further in FIG. 16, an ILD 64 is deposited over the etch stop layer 62. In an embodiment, the ILD 64 is a flowable film formed by a flowable CVD. In some embodiments, the ILD 64 is formed of oxides such as silicon oxide, PSG, BSG, BPSG, USG, low-k dielectrics such as carbon doped oxides, extremely low-k dielectrics such as porous carbon doped silicon dioxide, a polymer such as polyimide, the like, or a combination thereof. The low-k dielectric materials may have k values lower than 3.9. The ILD 64 may be deposited by any suitable method such as by CVD, ALD, a SOD process, the like, or a combination thereof.

Further in FIG. 16, contacts 66A1, 66A2, 66B, and 66C are formed through the ILD 64 and the etch stop layer 62 to electrically and physically contact respective contacts 60A1, 60A2, 60B, and 60C. The openings for the contacts 66 may be formed by using acceptable etching techniques. In an embodiment, the openings are formed by an anisotropic dry etch process. These openings are filled with a conductive layer 66. In some embodiments, the conductive layer 66 includes a barrier layer (not shown). The barrier layer helps to block diffusion of the subsequently formed conductive layer 66 into adjacent dielectric materials such as ILD 64 and etch stop layer 62. The barrier layer may be made of titanium, titanium nitride, tantalum, tantalum nitride, manganese, manganese oxide, cobalt, cobalt oxide, cobalt nitride, nickel, nickel oxide, nickel nitride, silicon carbide, oxygen doped silicon carbide, nitrogen doped silicon carbide, silicon nitride, aluminum oxide, aluminum nitride, aluminum oxynitride, a polymer such as polyimide, PBO the like, or a combination thereof. The barrier layer may be formed by CVD, PVD, PECVD, ALD, SOD, the like, or a combination thereof. In some embodiments, the barrier layer is omitted.

The conductive layer 66 may be made of tungsten, copper, aluminum, the like, or a combination thereof. The conductive layer 66 may be formed through a deposition process such as electrochemical plating, PVD, CVD, the like, or a combination thereof. In some embodiments, the conductive layer 66 is formed on a copper containing seed layer, such as AlCu.

In some embodiments, the conductive layer 66 is formed to have excess material overlying a top surface of the ILD 64. In these embodiments, the conductive layer 66 is planarized by a grinding process such as a CMP process to form conductive features 66A1, 66A2, 66B, and 66C. In some embodiments, the top surfaces of the conductive features 66A1, 66A2, 66B, and 66C are level with the top surface of the ILD 64 after the planarization process.

Embodiments of the present disclosure may achieve advantages, namely a self-alignment scheme between two layers that allows for protection of the underlying features. In some embodiments, the self-alignment scheme utilizes multiple mask layers overlying conductive features of the lower layers to protect the conductive features from unintended exposure during contact opening etching processes. In some embodiments, at least one of the multiple mask layers are a metal nitride or a metal oxide mask layer and provide sufficient protection and etch selectivity during the self-aligned contact opening etching processes. In a FET embodiment with two hard mask layers, the upper hard mask layer made of metal nitride or metal oxide ensures that the self-aligned contact does not short one of the gate electrodes to the corresponding source/drain region. In addition, in some embodiments, the lower hard mask layer is recessed before the application of the upper hard mask layer, and this recessing of the lower hard mask layer may substantially if not completely remove any seams and/or voids in the lower hard mask layer. Further, the material composition of the upper hard mask layer is important as it ensures a high film density and a non-volatile etching byproduct, such as, for example a metal fluoride etching byproduct. Even further, the materials available for use in the upper hard mask layer are larger than the materials available for use in the lower hard mask layer because the upper hard mask layer will be subsequently removed, and thus, its materials will not impact subsequent processing.

An embodiment is a method including forming a first gate over a substrate, the first gate having first gate spacers on opposing sidewalls of the first gate, forming a first hard mask layer over the first gate, forming a second hard mask layer over the first hard mask layer, the second hard mask layer having a different material composition than the first hard mask layer, forming a first dielectric layer adjacent and over the first gate, etching a first opening through the first dielectric layer to expose a portion of the substrate, at least a portion of the second hard mask layer being exposed in the first opening, filling the first opening with a conductive material, and removing the second hard mask layer and the portions of the conductive material and first dielectric layer above the first hard mask layer to form a first conductive contact in the remaining first dielectric layer.

Another embodiment is a method including forming a first metal gate and a second metal gate over a substrate, the first metal gate and the second metal gate each having gate spacers on opposing sidewalls of the respective metal gates, forming a first dielectric layer over the substrate and adjacent the first and second metal gates, recessing the first metal gate and the second metal gate to have top surfaces below a top surface of a the first dielectric layer, forming a first hard mask layer on the recessed top surfaces of the first metal gate and the second metal gate, recessing the first hard mask layer to have top surfaces below the top surface of the first dielectric layer, forming a second hard mask layer on the recessed top surfaces of the first hard mask layer, the second hard mask layer having a different material composition than the first hard mask layer, and planarizing the second hard mask layer to have a top surface coplanar with the top surface of the first dielectric layer.

A further embodiment is a structure including a first gate stack on a substrate, the first gate stack comprising a first high-k gate dielectric layer and a first metal gate electrode, a first hard mask layer on the first gate stack, a first set of gate spacers on opposing sidewalls of the first gate stack and the first set of gate spacers, a first etch stop layer on sidewalls of the first set of gate spacers, a first interlayer dielectric surrounding the first etch stop layer and the first gate stack, the first interlayer dielectric contacting at least a portion of the first etch stop layer, a first conductive contact extending through the first interlayer dielectric to contact a top surface of the substrate, the first conductive contact having sidewalls contacting sidewalls of the first etch stop layer, a second etch stop layer over and contacting top surfaces of the first etch stop layer, the first set of gate spacers, the first hard mask layer, and the first interlayer dielectric, a second interlayer dielectric over the second etch stop layer, and a second conductive contact extending through the second interlayer dielectric and the second etch stop layer to contact the first conductive contact.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first gate over a substrate, the first gate having first gate spacers on opposing sidewalls of the first gate;
   forming a first hard mask layer over the first gate;
   forming a second hard mask layer over the first hard mask layer, the second hard mask layer having a different material composition than the first hard mask layer;
   forming a first dielectric layer adjacent and over the first gate;
   etching a first opening through the first dielectric layer to expose a portion of the substrate, at least a portion of the second hard mask layer being exposed in the first opening;
   filling the first opening with a conductive material; and
   removing the second hard mask layer and the portions of the conductive material and first dielectric layer above the first hard mask layer to form a first conductive contact in the remaining first dielectric layer.

2. The method of claim 1, wherein the second hard mask layer comprises a metal nitride or a metal oxide.

3. The method of claim 2, wherein the second hard mask layer comprises TiO, HfO, AlO, ZrO, ZrN, or a combination thereof.

4. The method of claim 1, wherein the first gate spacers extend along opposing sidewalls of the first hard mask layer.

5. The method of claim 4, wherein the second hard mask layer is on top surfaces of the first gate spacers.

6. The method of claim 1, wherein the first gate comprises a high-k gate dielectric layer on the substrate and along inner sidewalls of the first gate spacers and a metal gate electrode on the high-k gate dielectric layer.

7. The method of claim 1, wherein forming the first gate over the substrate comprises:
   forming a first dummy gate over the substrate, the first dummy gate comprising a first dummy gate dielectric on the substrate and a first dummy gate electrode on the first dummy gate dielectric;
   forming the first gate spacers on opposing sidewalls of the first dummy gate;
   forming source/drain regions in the substrate using the first dummy gate and first gate spacers as a mask;
   forming a first etch stop layer over the substrate, first dummy gate, and the first gate spacers;
   forming a first portion of the first dielectric layer over the first etch stop layer;
   planarizing the first portion of the first dielectric layer to expose a portion of the first dummy gate; and
   replacing the first dummy gate with the first gate.

8. The method of claim 1 further comprising:
   recessing the first gate to have a top surface below a top surface of a first portion of the first dielectric layer, the first hard mask layer being formed on the recessed top surface of the first gate;
   recessing the first hard mask layer to have a top surface below the top surface of the first portion of the first dielectric layer, the second hard mask layer being formed on the recessed top surface of the first hard mask layer; and
   planarizing the second hard mask layer to have a top surface coplanar with the top surface of the first portion of the first dielectric layer.

9. The method of claim 8 further comprising:
   forming a second portion of the first dielectric layer over the planarized second hard mask layer and first portion of the first dielectric layer, the first opening extending through the second portion and the first portion of the first dielectric layer;
   after the removing the second hard mask layer, forming a second etch stop layer over the first hard mask layer and the first portion of the first dielectric layer;
   forming a second dielectric layer over the second etch stop layer; and
   forming a second conductive contact through the second dielectric layer and the second etch stop layer to the first conductive contact.

10. The method of claim 9, wherein a bottom surface of the second conductive contact contacts a top surface of the first hard mask layer and a top surface of the first conductive contact.

11. A method comprising:
    forming a first metal gate and a second metal gate over a substrate, the first metal gate and the second metal gate each having gate spacers on opposing sidewalls of the respective metal gates;
    forming a first dielectric layer over the substrate and adjacent the first and second metal gates;
    recessing the first metal gate and the second metal gate to have top surfaces below a top surface of a the first dielectric layer;
    forming a first hard mask layer on the recessed top surfaces of the first metal gate and the second metal gate;
    recessing the first hard mask layer to have top surfaces below the top surface of the first dielectric layer;
    forming a second hard mask layer on the recessed top surfaces of the first hard mask layer, the second hard mask layer having a different material composition than the first hard mask layer; and
    planarizing the second hard mask layer to have a top surface coplanar with the top surface of the first dielectric layer.

12. The method of claim 11 further comprising:
    forming a second dielectric layer over the planarized second hard mask layer and first hard mask layer;
    etching a first opening through the second and first dielectric layers to expose a portion of the substrate, at least a portion of the second hard mask layer overlying the first metal gate being exposed in the first opening;
    filling the first opening with a conductive material; and
    removing the second hard mask layer and the portions of the conductive material and second and first dielectric layer above the first hard mask layer to form a first conductive contact in the first dielectric layer.

13. The method of claim 12, wherein an entire top surface of the second hard mask layer overlying the first metal gate is exposed in the first opening.

14. The method of claim 12 further comprising:
    etching a second opening through the second dielectric layer, the second hard mask layer, and the first hard mask layer to expose a portion of the second metal gate; and
    filling the second opening with the conductive material, the removing the second hard mask layer and the portions of the conductive material and second and first dielectric layer above the first hard mask layer forming a second conductive contact in the first hard mask layer.

15. The method of claim 11, wherein the second hard mask layer comprises a metal nitride or a metal oxide.

16. The method of claim 11, wherein the first metal gate comprises a high-k gate dielectric layer on the substrate and along inner sidewalls of the gate spacers and a metal gate electrode on the high-k gate dielectric layer.

17. The method of claim 11, wherein forming the first metal gate and the second metal gate over the substrate comprises:
   forming a first dummy gate and a second dummy gate over the substrate;
   forming the gate spacers on opposing sidewalls of the first dummy gate and the second dummy gate;
   forming a first etch stop layer over the substrate, first dummy gate, the second dummy gate, and the gate spacers;
   forming the first dielectric layer over the first etch stop layer;
   planarizing the first dielectric layer to expose portions of the first dummy gate and the second dummy gate; and
   replacing the first dummy gate with the first metal gate and the second dummy gate with the second metal gate.

18. A structure comprising:
   a first gate stack on a substrate, the first gate stack comprising a first high-k gate dielectric layer and a first metal gate electrode;
   a first hard mask layer on the first gate stack;
   a first set of gate spacers on opposing sidewalls of the first gate stack and the first hard mask layer;
   a first etch stop layer on sidewalls of the first set of gate spacers;
   a first interlayer dielectric surrounding the first etch stop layer and the first gate stack, the first interlayer dielectric contacting at least a portion of the first etch stop layer;
   a first conductive contact extending through the first interlayer dielectric to contact a top surface of the substrate, the first conductive contact having sidewalls contacting sidewalls of the first etch stop layer;
   a second etch stop layer over and contacting top surfaces of the first etch stop layer, the first set of gate spacers, the first hard mask layer, and the first interlayer dielectric;
   a second interlayer dielectric over the second etch stop layer; and
   a second conductive contact extending through the second interlayer dielectric and the second etch stop layer to contact the first conductive contact.

19. The structure of claim 18, wherein a bottom surface of the second conductive contact contacts top surfaces of the first hard mask layer, the first set of gate spacers, the first etch stop layer, and the first conductive contact.

20. The structure of claim 18 further comprising a first source/drain region in the substrate, the first conductive contact contacting the first source/drain region.

* * * * *